(12) United States Patent
Jungerman et al.

(10) Patent No.: US 6,564,160 B2
(45) Date of Patent: May 13, 2003

(54) RANDOM SAMPLING WITH PHASE MEASUREMENT

(75) Inventors: Roger L. Jungerman, Petaluma, CA (US); Lovell H. Camnitz, Mountain View, CA (US); Randall King, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 76 days.

(21) Appl. No.: 09/887,992

(22) Filed: Jun. 22, 2001

(65) Prior Publication Data

US 2002/0198672 A1 Dec. 26, 2002

(51) Int. Cl.⁷ .................... G01R 35/00; G06F 19/00
(52) U.S. Cl. ................ 702/106; 702/76; 375/215; 331/44; 331/172
(58) Field of Search .............. 702/106, 72; 377/103; 375/215; 455/260; 331/34, 44, 172; 324/601

(56) References Cited

U.S. PATENT DOCUMENTS

| | | | | |
|---|---|---|---|---|
| 3,631,422 A | * | 12/1971 | Krajewski et al. ............ 360/40 |
| 4,634,970 A | * | 1/1987 | Payne et al. ............ 324/121 R |
| 4,812,769 A | * | 3/1989 | Agoston .................... 327/261 |
| 5,414,567 A | * | 5/1995 | Amada et al. ................ 386/29 |
| 6,014,042 A | * | 1/2000 | Nguyen ........................ 327/3 |
| 6,057,715 A | * | 5/2000 | Kawasaki ................... 327/106 |
| 6,219,172 B1 | * | 4/2001 | Yariv ......................... 359/264 |
| 6,324,225 B1 | * | 11/2001 | Brianti et al. ............... 375/341 |
| 6,442,145 B1 | * | 8/2002 | De Lange et al. .......... 370/310 |
| 2001/0013802 A1 | * | 8/2001 | Faulcon et al. ............ 327/244 |

OTHER PUBLICATIONS

S. Nogiwa et. al, *Improvement of sensitivity in Optical Sampling System, Electronics Letters,* May 27, 1999, vol. 35, No. 11.

* cited by examiner

*Primary Examiner*—John Barlow
*Assistant Examiner*—Meagan Walling

(57) ABSTRACT

Repetitive sampling of a data signal is performed. A clock reference is generated. The clock reference has a known period relationship with the data signal. The clock reference and the data signal are simultaneously sampled. The sampled information from the clock reference is used to determine in what phase of the clock reference sampled values of the data signal occur.

22 Claims, 12 Drawing Sheets

RANDOM SAMPLING WITH PHASE MEASUREMENT

BACKGROUND

The present invention concerns sampling methods used within oscilloscopes and pertains particularly to random sampling with phase measurement In oscilloscopes, three different repetitive sampling methods are traditionally employed. Sequential sampling is used in equivalent time sampling scopes. In sequential sampling systems, each sample is taken at successively longer delays after a repetitive trigger event. Alternatively, the signal repetition frequency is phase locked to the sampling signal with a small fixed frequency offset. S. Nogiwa et. al, *Improvement of sensitivity in Optical Sampling System, Electronics Letters*, May 27, 1999, Vol. 35, No. 11.

Non sequential sampling is used in a microwave transition analyzer. The sampling pulses and the users signal are phase locked. Each has a more arbitrary, but known frequency.

The third repetitive sampling method is random sampling. In random sampling systems, the phase of the samples is typically not related to the repetitive signal input. The position of each sample on the time axis of the oscilloscope display is obtained by measuring the phase of each sample relative to a trigger signal. See, for example U.S. Pat. No. 4,884,020. For additional background information on random electrical sampling, see, for example, U.S. Pat. No. 5,315,627, U.S. Pat. No. 4,928,251, U.S. Pat. No. 4,719,416, U.S. Pat. No. 4,578,667 and U.S. Pat. No. 4,495,586.

In optical sampling oscilloscopes sequential sampling is typically used. There have been a number of disadvantages with the use of sequential sampling. For example, there is significant jitter in phase locking of the source. The narrow frequency range of the phased locked loop (PLL) used in such applications limits the range of input frequencies of the signal to be measured. Also, to construct a PLL, the phase must be measured and the source frequency controlled. Also the PLL requires an optical pulsed laser source with tunable repetition frequency which is expensive.

SUMMARY OF THE INVENTION

In accordance with the preferred embodiment of the present invention, repetitive sampling of a data signal is performed. A clock reference is generated. The clock reference has a known period relationship with the data signal. The clock reference and the data signal are simultaneously sampled. The sampled information from the clock reference is used to determine in what phase of the clock reference sampled values of the data signal occur.

DESCRIPTION OF THE PREFERRED EMBODIMENT

In the preferred embodiments of the present invention, when a measured parameter is sampled, the time axis value of the sample can be determined in a random or sequential sampling system by measuring one or more additional vertical channels at the same time or with a known timing relationship between the vertical channels. This signal or signals is called the clock reference. The clock reference is repetitive with a known period relationship between the data on the vertical axis and the clock reference.

The shape of the clock reference signals as a function of time is used to calculate the time value using a method such as a look-up table. The shape of the signal versus time can be determined by knowing an approximate functional form and then fitting numerous actual clock reference data points to the function using least square error or other curve fitting approaches to obtain a self-consistent description of the data set. This can work for a completely random sampling system with no knowledge of the sample time, for example, by fitting harmonically distorted sine waves with calculated phase offset to data from two clock reference channels.

If another time base is used to give approximate information on the time of the sample, data from the clock reference can be used to compensate for jitter and place the time axis value of the point more accurately. An example is using a sequential time base with pattern trigger to give an approximate location of a sample and the dual channel quadrature time base to remove jitter up to one bit period.

Another example is using a single channel clock reference channel with a characterized slope to remove jitter in a sequential time base over a limited range of time values.

Using more than one clock reference channel removes ambiguity if the clock reference is not single valued (e.g. rising or falling edge of a sine wave) and to improve accuracy at points where the slope of the Clock Reference signal verses time is small. Noise in the measurement of the vertical channel value of the clock reference will translate to a time error (jitter) inversely proportional to the slope of the clock reference versus time. While a single sharp saw-tooth signal is adequate in many cases as a single clock reference, it is difficult to make a perfectly sharp saw-tooth signal. An additional clock reference channel improves time accuracy in regions where the first signal has a shallow slope.

In many practical systems a low jitter sequential time base is difficult to design, particularly over a wide range of frequencies. This clock reference approach makes it possible to let the sampling source free-run and to effectively "time-stamp" each point. This can reduce the system cost, allow it to operate at a wide range of repetition frequencies and reduce the jitter.

Figure 1:
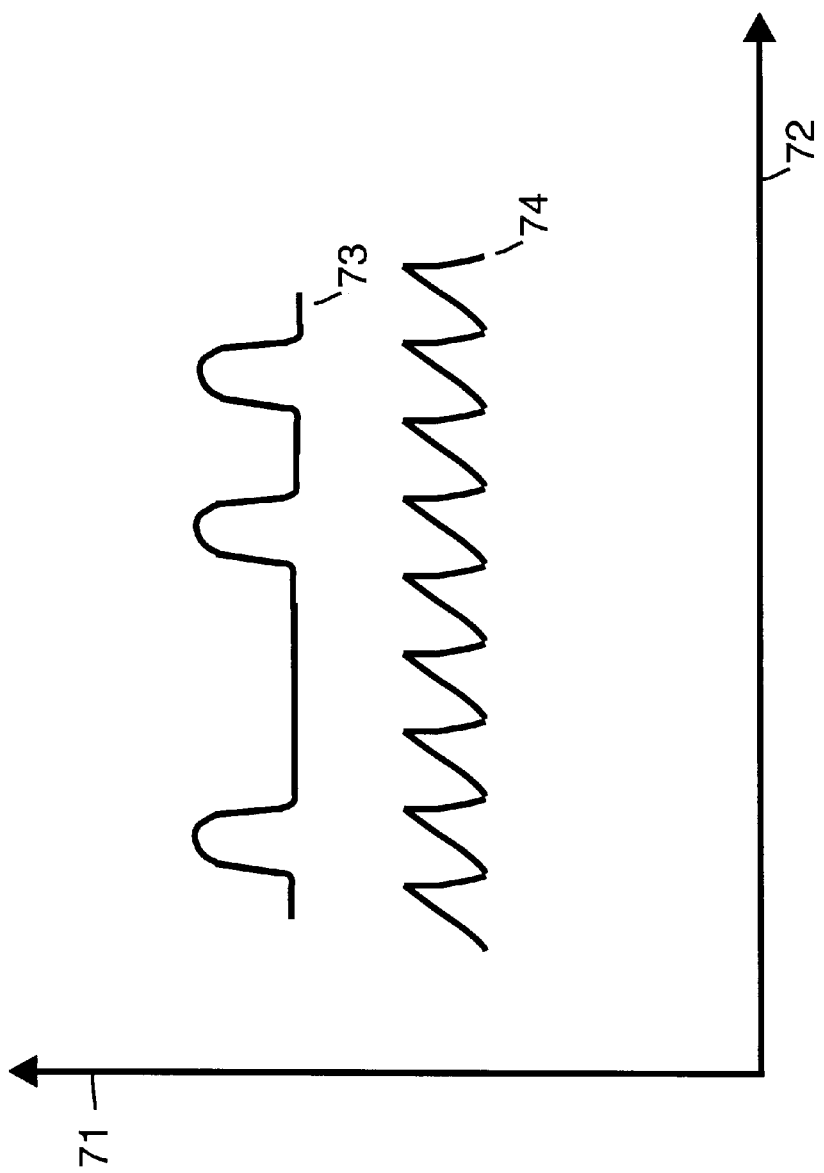
FIG. 1 shows a vertical axis, a horizontal axis, a waveform that represents vertical channel data and a waveform that represents a clock reference in accordance with a preferred embodiment of the present invention.

FIG. 1 shows a vertical axis 71 that represents voltage or optical power or some other measured value. For example, in alternative embodiments of the present invention, vertical axis 71 represents phase, modulation or some other measured value. A horizontal axis 72 represents time. For example, in alternative embodiments of the present invention, horizontal axis 72 represents frequency or some other value. In alternative embodiments of the present invention, the orientation of the horizontal axis and the vertical axis can also be switched, for example, so that the vertical axis is used to represent time or frequency and the horizontal axis is used to represent voltage, optical power, phase, modulation or some other measured value.

A waveform 73 represents vertical channel data. A waveform 74 represents a clock reference. For example, the clock reference has roughly a sawtooth form. By simultaneously sampling the vertical channel data and the clock reference, sampling data can be taken in random order then reconstructed (sorted) over one period of the clock reference to form an eye diagram. This is represented in FIG. 2.

Figure 2:
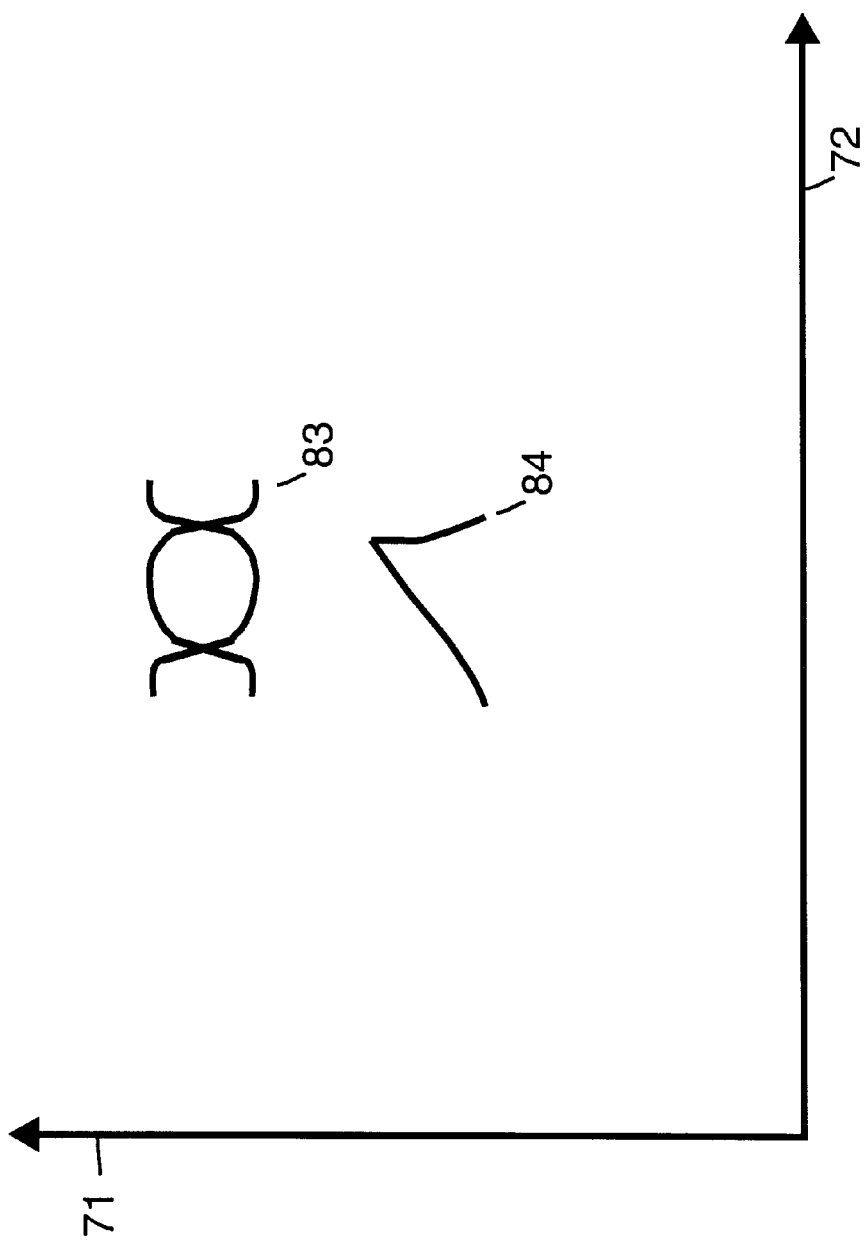
FIG. 2 shows a waveform that represents vertical channel data, roughly in the shape of an eye and a waveform that represents one cycle of the clock reference in accordance with a preferred embodiment of the present invention.

FIG. 2 shows vertical axis 71 and horizontal axis 72. A waveform 83 represents vertical channel data, roughly in the shape of an eye. A waveform 84 represents one cycle of the clock reference.

Figure 3:
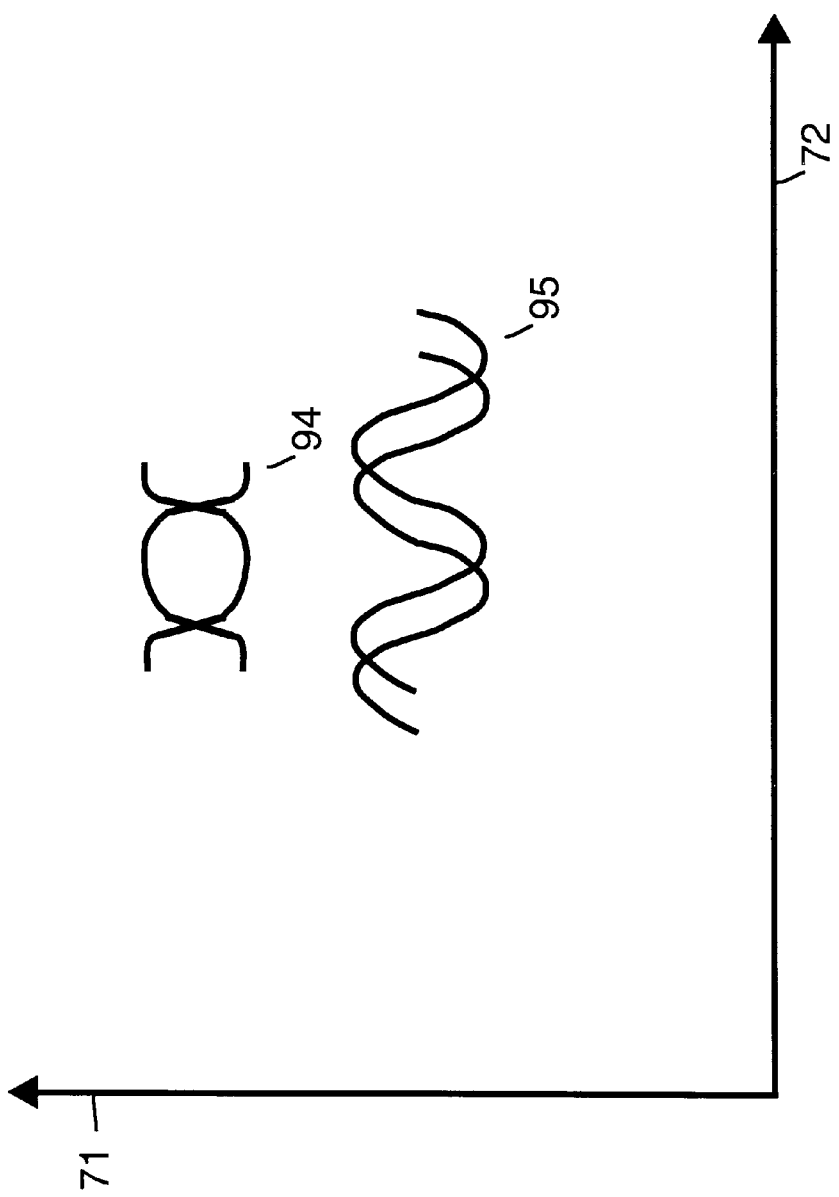
FIG. 3 illustrates that it is possible to use two sine waves roughly in quadrature as the clock reference in accordance with a preferred embodiment of the present invention.

FIG. 3 illustrates that it is possible to use two sine waves roughly in quadrature as the clock reference. FIG. 3 shows vertical axis 71 and horizontal axis 72. A waveform 94 represents vertical channel data, roughly in the shape of an eye. A waveform 95 represents two sine waves roughly in quadrature as the clock reference.

Figure 4:
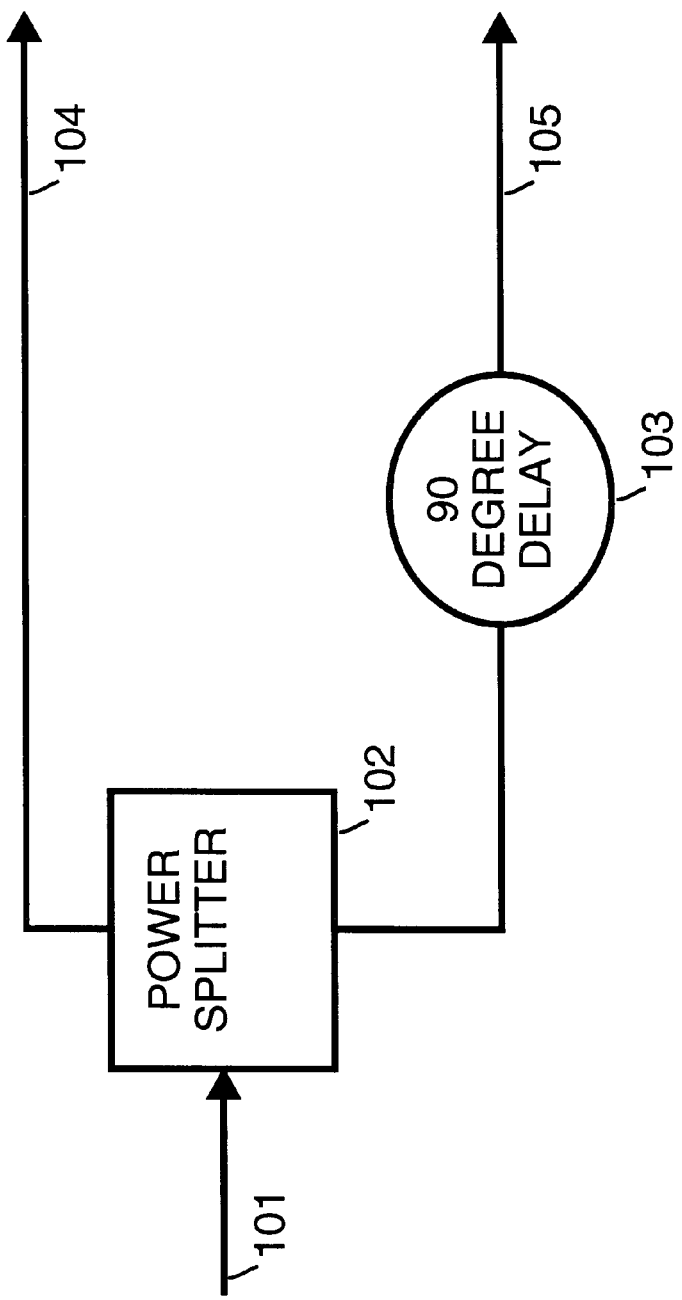
FIG. 4 shows a power splitter being used to form quadrature signals by splitting a roughly sinusoidal input signal in accordance with a preferred embodiment of the present invention.

FIG. 4 shows a power splitter 102 being used to form quadrature signals 104 and 105 by splitting a roughly sinusoidal input signal 101. The path for signal 105 is delayed with respect to the other by use of a 90 degree delay 103. Signals 101, 104 and 105 can be electrical or optical. Delay 103 is implemented, for example, using a length of coaxial cable or fiber optic. As the clock reference frequency is varied the delay will deviate from 90 degrees. A variable delay line (fiber optic or electrical) can be used to compensate. Mathematical curve fitting can calibrate out non-ideal delays and other distortions to the sinusoids.

Figure 5:
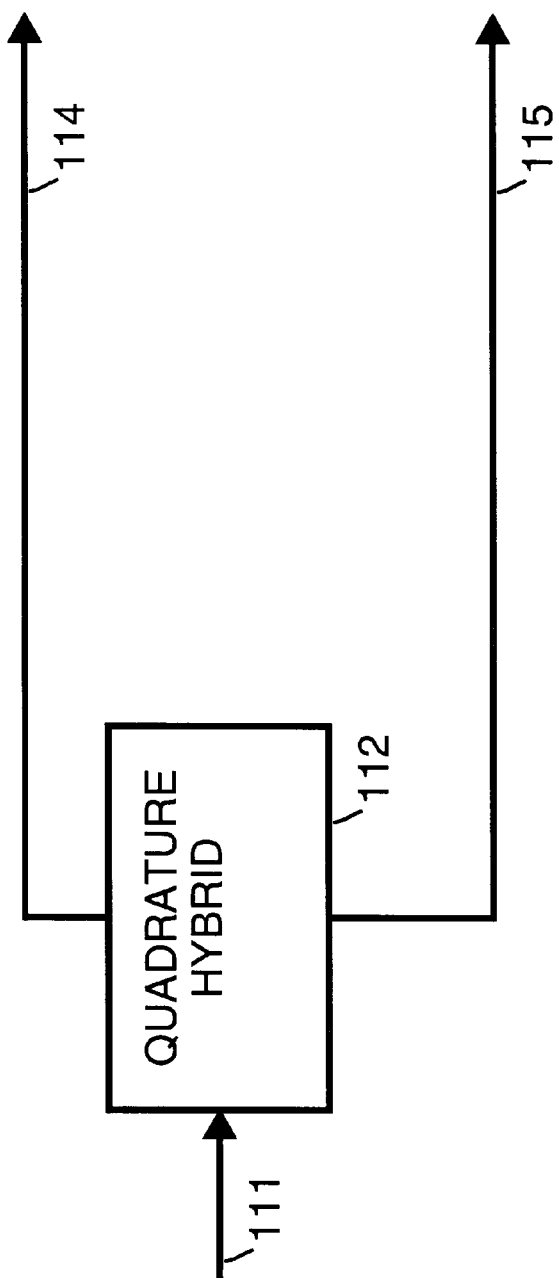
FIG. 5 illustrates that for electrical signals a quadrature hybrid can replace the power splitter in accordance with a preferred embodiment of the present invention.

As illustrated by FIG. 5, for electrical signals a quadrature hybrid 112 can replace the power splitter. Quadrature hybrid 112 receives a roughly sinusoidal input signal 111 and provides two output signals 114 and 115 roughly in quadrature over a wide range of frequencies. This is a preferred embodiment for electrical signals.

Figure 6:
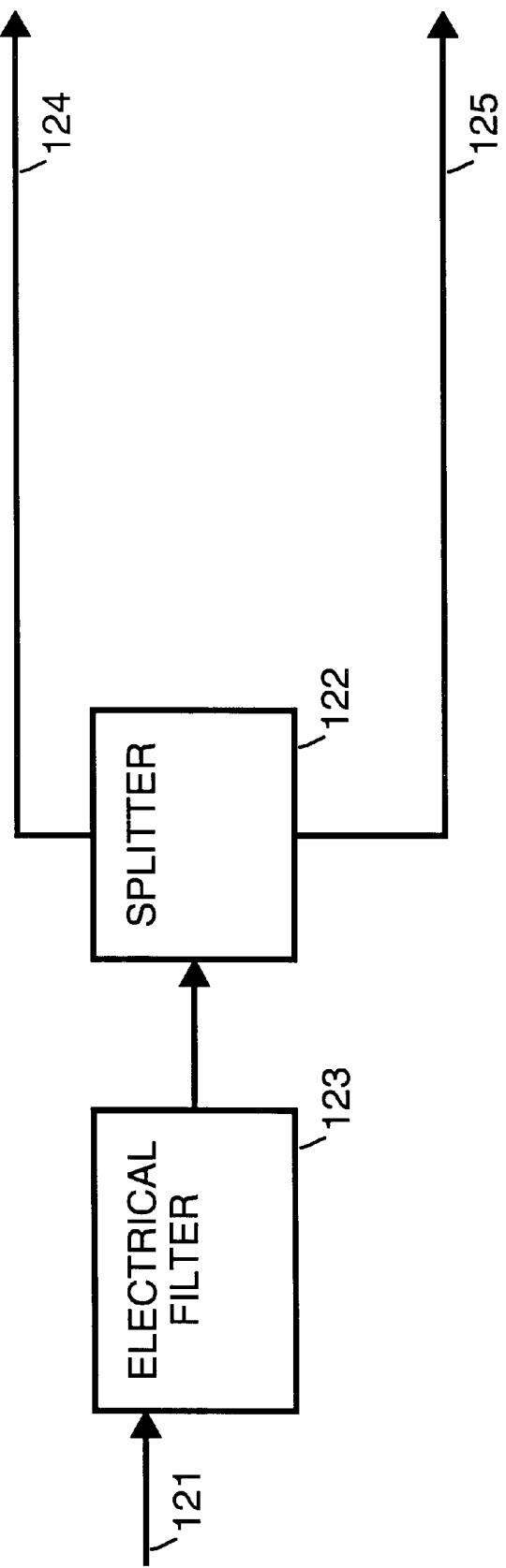
FIG. 6 illustrates the use of a filter before the use of a splitter in accordance with a preferred embodiment of the present invention.

Harmonic or other distortion will cause nonlinearities in the time base, if ideal sinusoids are assumed. Also, if the harmonic content is large (for example, odd harmonics in a square wave) flat points may occur in both quadrature channels at the same time position and give uncertainty in the time calculation. An electrical low pass or band pass filter will reduce this problem. The filters can be switched to cover a wider frequency range This is illustrated by FIG. 6. In FIG. 6, an electrical filter 123 receives a roughly sinusoidal input signal 121. After filtering, the signal is forwarded to splitter 122 which provides two output reference signals 124 and 125.

If the filter is not perfect, mathematical curve fitting can compensate. This will calibrate time base nonlinearities. Deviations from an ideal fit to the model give an indication of the jitter and nonlinearities in the time base.

Figure 7:
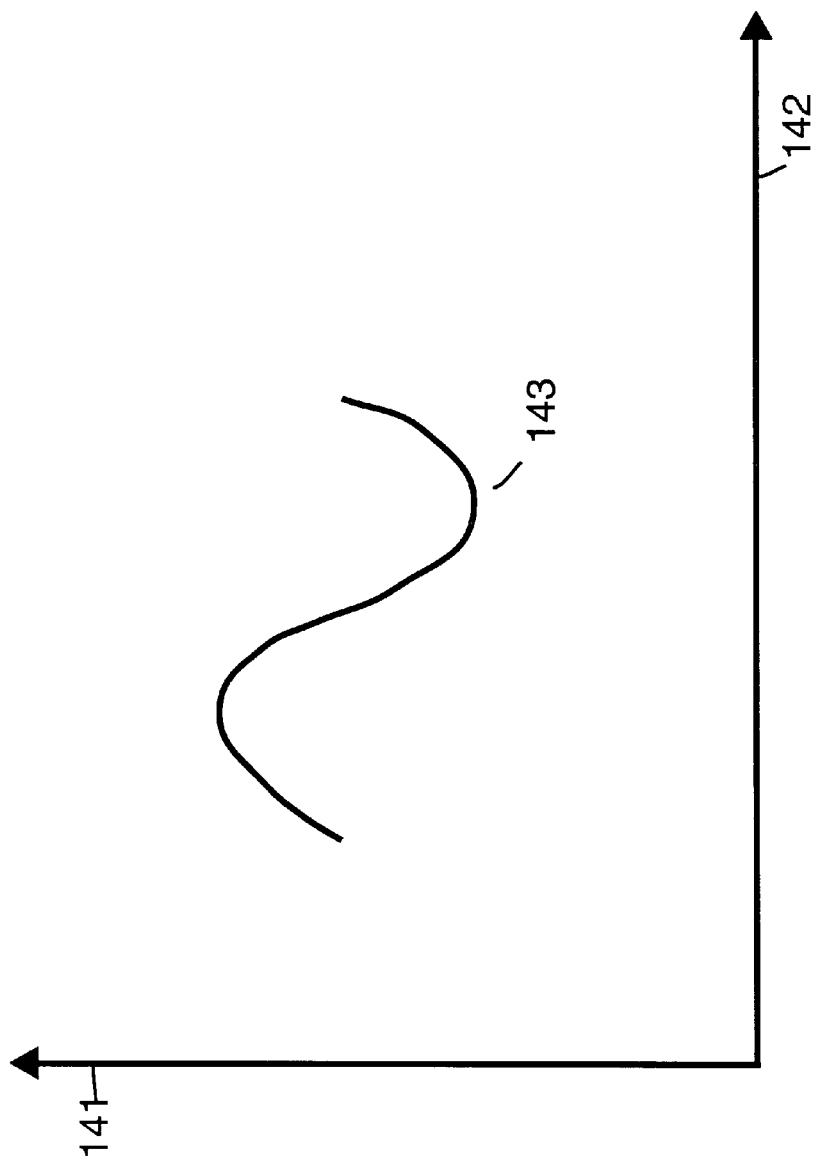
In FIG. 7, a waveform illustrates values shown as a function of time for an ideal signal with no third harmonic in accordance with a preferred embodiment of the present invention.

For example, in FIG. 7 a waveform 143 illustrates values shown as a function of time (for an ideal signal with no third harmonic). A vertical axis 141 represents voltage or optical power or some other measured value. A horizontal axis 142 represents time.

Figure 8:
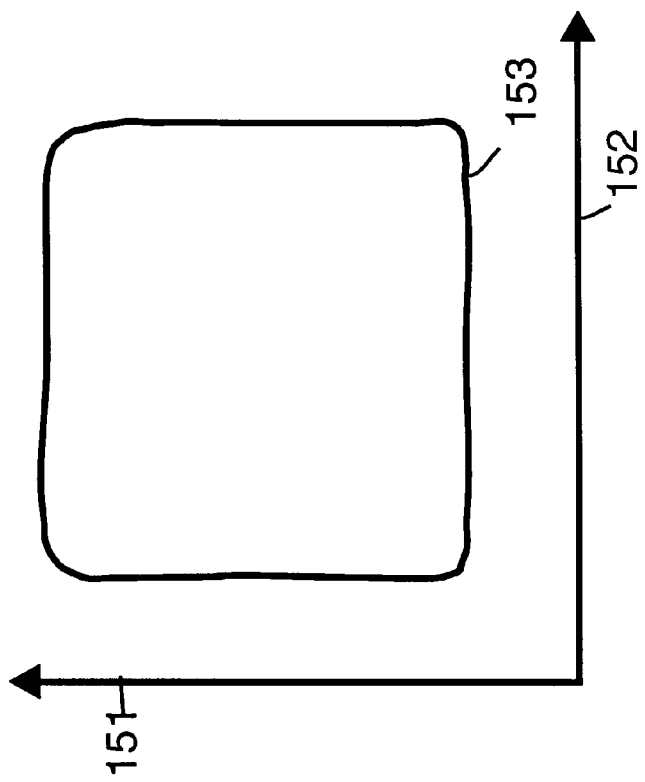
FIG. 8 shows an x-y plot of the two quadrature channels with respect to each other in accordance with a preferred embodiment of the present invention.

FIG. 8 shows an x-y plot 153 of the two quadrature channels with respect to each other. A vertical axis 151 represents a value for the first clock reference. A horizontal axis 152 represents a value for the second clock reference. The third harmonic results in a squaring of the corners. With only this x-y plot the random sampled time values can be sorted and placed appropriately. This functional form can then be used to place subsequent points on the time axis. The non-perfect phase angle between the phases results in an ellipse instead of a circle. The curve fitting algorithm can evaluate these parameters.

The sampling of the vertical channels and the clock reference is performed at as close as possible to same relative time. Random variation in the time between the sampling of the multiple channels gives jitter. Systematic delays between channels can be compensated for.

The clock reference signal can be used by itself to perform the time base calculation on either optical or electrical signals. Optical sampling can be performed using a photoconductive switch (PCS) or an electro-optic modulator. Electrical sampling can be performed using a diode sampler. A preferred embodiment is the dual-channel quadrature electrical sampling using the quadrature hybrid.

Figure 9:
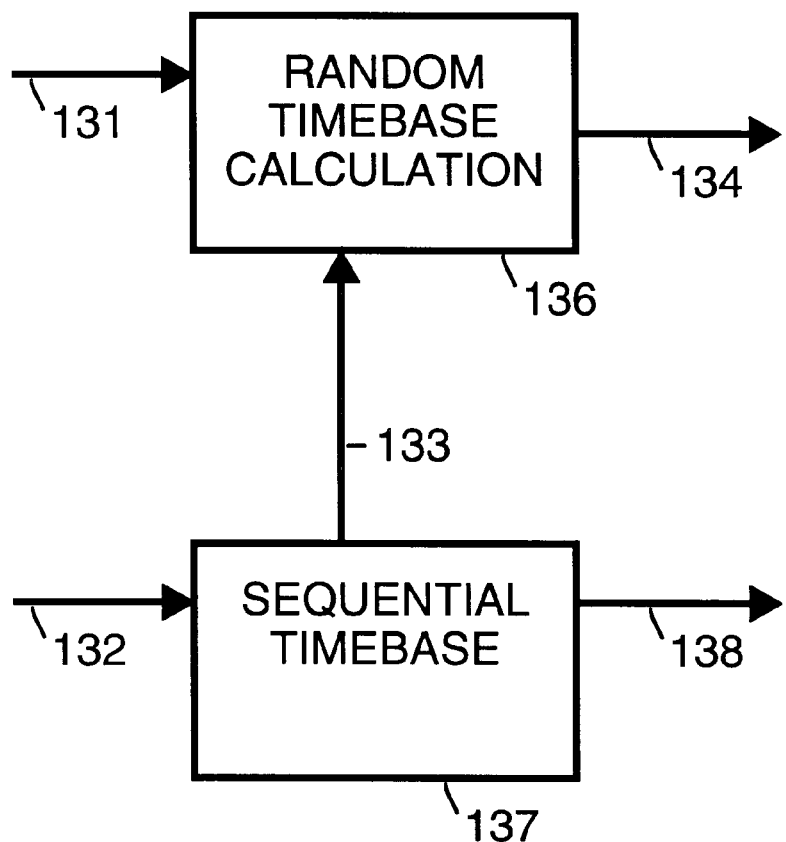
FIG. 9 illustrates a clock reference being used in conjunction with a sequential time base used to "clean up" the jitter on a pattern trigger signal when using a common sampling strobe in accordance with a preferred embodiment of the present invention.

FIG. 9 illustrates a clock reference 131 being used in conjunction with a sequential time base 137. Sequential time base 137 is used to "clean up" the jitter on a pattern trigger signal 132 when using a common sampling strobe 138. For example, pattern trigger signal 132 is a repetitive digital pattern that has a pattern trigger that always occurs at a selected bit position in the pattern. Sequential time base 137 triggers on this bit and produces a triggered waveform (a series of bits rather than an eye-diagram). However, jitter in the sequential time base 137 and input pattern trigger 132 will jitter or smear the observed waveform. If the jitter is less than one unit interval (one bit), random time base calculation 136 can use clock reference 131 to fine-tune the time position to eliminate the jitter in a time axis value 134. A dual channel quadrature time base implementation is a preferred embodiment to generate clock reference 131.

Sequential time base 137 generates a sequential time base sampling delay 133 that indicates delay between pattern trigger signal 132 and common sampling strobe 138. Random time base calculation 136 uses sequential time base sampling delay 133 along with clock reference 131 to accurately calculate the timing of common sampling strobe 138. Clock reference 131 is used to compensate for jitter and non-linearity within sequential time base 137 and input pattern trigger 132.

Sampling can be either optical or electrical. Alternatively, sampling can be performed using some other method or combination of methods. For example, the vertical channel can be obtained by optical sampling, while the clock reference is sampled electrically. In one preferred embodiment for optical sampling, quadrature sampling is performed with two electro-optic modulators in quadrature.

Figure 10:
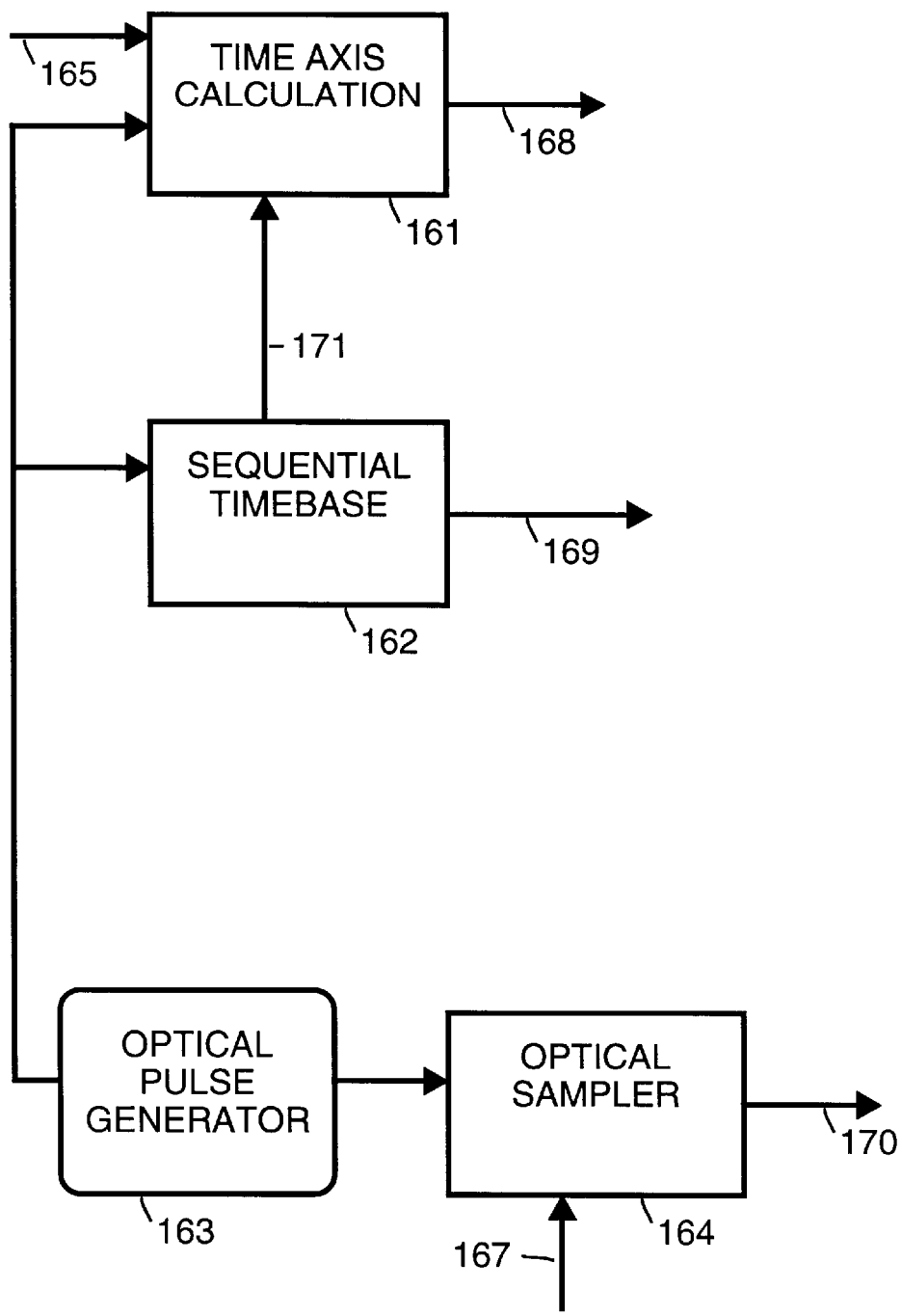
FIG. 10 illustrates an embodiment of the present invention that uses electrical sampling of electrical clock reference channel inputs and optical sampling of vertical axis input in accordance with a preferred embodiment of the present invention.

FIG. 10 illustrates an embodiment which uses electrical sampling of electrical clock reference channel inputs 165 and optical sampling of vertical axis input 167. Optical pulse generator 163 (optical pulse source) is asynchronous to electrical clock reference channel inputs 165 (the electrical clock reference). The timing of a sampling strobe (trigger) 171 for electrical clock reference channel inputs 165 is obtained from an optical pulse generator 163 with a trigger from sequential time base 162. In one embodiment, sampling strobe 171 from sequential time base 162 has significant jitter. An electrically detected output from optical pulse generator 163 goes into one of the vertical channels of the system. Sampling strobe 171 from sequential time base 162 is essentially the same signal. By suitably delaying the vertical channel relative to sampling strobe 171 signal, the vertical channel can be used to measure itself for a fixed delay. This gives a slope of vertical signal level versus sampling time that can be used to compensate for jitter in the sequential time base. This is an example of performing a time jitter compensation using only a single vertical channel.

Sequential time base 162 always samples the electrically detected optical pulse at nearly the same point on the slope. Due to jitter this point will vary up and down. The optical pulse clock from optical pulse generator 163 is asynchronous with respect to electrical clock reference channel inputs 165 so the samples will randomly fall at all time points on the user data. This data is sorted by the time axis calculation 161. A time axis measurement 168 is generated for use in displaying data to a user.

The quadrature sampling approach is limited to measuring the phase of each time sample in the bit period of the clock reference signal. The clock reference signal may be at a sub-multiple of the system data rate. For example, in a 40 gigabit per second (Gb/s) system, the clock reference signal could be at 10 Gb/s. In this case, four bits of data will appear in one period of the clock reference signal. Often a high-speed optical signal, for example 40 Gb/s, is formed by optically combining four independent 10 Gb/s data streams. Any time skew between the data streams in the multiplexing process can be observed using the quadrature sampling scheme on the 10 GHz clock reference signal. If in the above case the 40 Gb/s data pattern is repetitive and four bits long, a "triggered" wave form will be displayed rather than an eye-diagram. The clock reference signal can be further divided down (for example, to 2.5 GHz) to observe a longer repetitive pattern, though the jitter performance will be degraded.

To achieve a pattern trigger on much longer repetitive sequences, the electrical clock reference can be counted in a high-speed latching counter. A pattern trigger can also be used to trigger the counter. In this way, the time position of each sampling point in relation to the repetitive pattern can be determined. A triggered waveform can thus be generated. More sampling points will be required for long patterns, to obtain the same number of samples per bit displayed. This can slow down the measurement.

Figure 11:
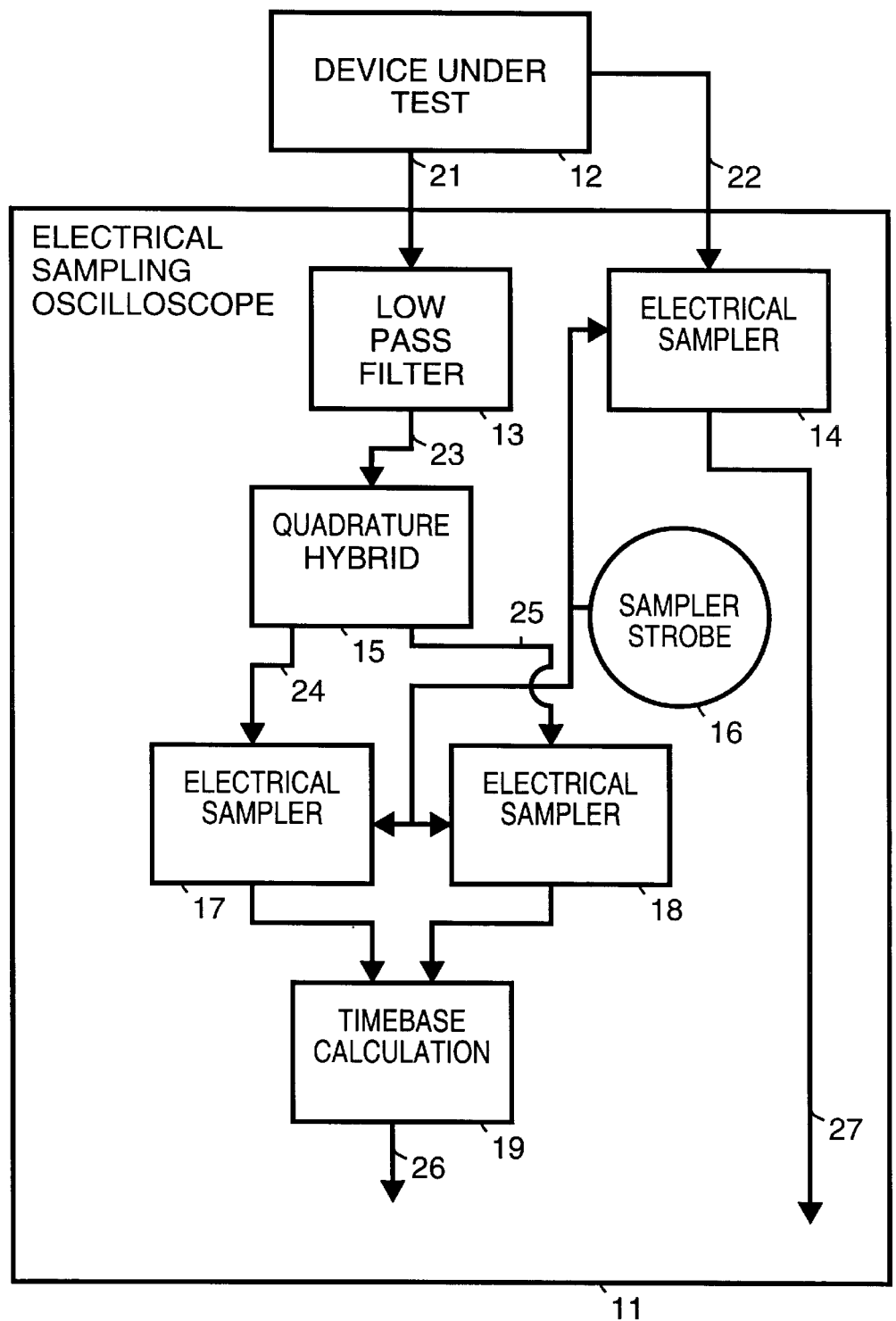
FIG. 11 is a simplified block diagram of an electrical sampling oscilloscope in accordance with a preferred embodiment of the present invention.

FIG. 11 is a simplified block diagram of an electrical sampling oscilloscope 11, also called a digital communications analyzer. A device under test 12 supplies to electrical sampling oscilloscope 11 a digital electrical data signal 22 and a synchronous electrical clock reference signal 21. Synchronous electrical clock reference signal 21 is used for horizontal time base information. Digital electrical data signal 22 is synchronous with synchronous electrical clock reference signal 21. Digital electrical data signal 22 is used for the vertical channel information.

A sampler strobe 16, when used as an oscilloscope trigger for eye diagrams, is free-running (random sampling). Sampler strobe 16 is used to simultaneously strobe an electrical sampler 14, an electrical sampler 17 and an electrical sampler 18. Electrical sampler 14, electrical sampler 17 and electrical sampler 18 thus all sample at the same time.

Electrical sampler 14 samples digital electrical data signal 22 and provides a vertical channel signal 27 which provides the vertical channel information used by oscilloscope 11 to generate a display.

A low pass filter 13 receives synchronous electrical clock reference signal 21 and generates a sinusoidal clock reference signal 23. A quadrature hybrid circuit 15 receives sinusoidal clock reference signal 23 and generates two signals ninety degrees out of phase, a sine reference signal 24 and a cosine reference signal 25.

Electrical sampler 17 samples sine reference signal 24 and forwards the results to a time base calculation circuit 19. Electrical sampler 18 samples cosine reference signal 24 and forwards the results to time base calculation circuit 19. Time base calculation circuit 19 performs an arctangent operation on the signals received from electrical sampler 17 and electrical sampler 18 to produce a time axis channel information reference signal 26.

The delay between signals generated by quadrature hybrid 15 is chosen to place the two time base sinusoidal electrical clock reference signals (sine reference signal 24 and a cosine reference signal 25) roughly in quadrature. The data is then taken in a random fashion. The standard oscilloscope time base can be either free-running or triggered. After a suitable number of random points are taken, the data is analyzed to determine the phase difference between the two quadrature time base signals (approximately 90 degrees). Thereafter it is possible to place each acquisition point (consisting of three values: two time base and one vertical) at the correct time location. Effectively the data is sorted and placed at the correct time location. The conventional oscilloscope time base is not used to place the time axis. This results in significantly reduced jitter (from approximately 2 picoseconds (ps) to approximately 200 femtoseconds (fs) in preliminary measurements).

An additional feature of all electrical measurements is to trigger a digital communications analyzer on a pattern trigger. This can be used to roughly place the time point of each sample to approximately two picosecond accuracy. In this case, the quadrature sinusoidal clock reference signal is also taken at each point. These calculated time base values can be used to find-tune the position of each time point to reduce the jitter in this triggered measurement. Thus, the concept of a high accuracy (low jitter) time base can be extended to triggered measurements and not just be used for eye diagrams.

Figure 12:
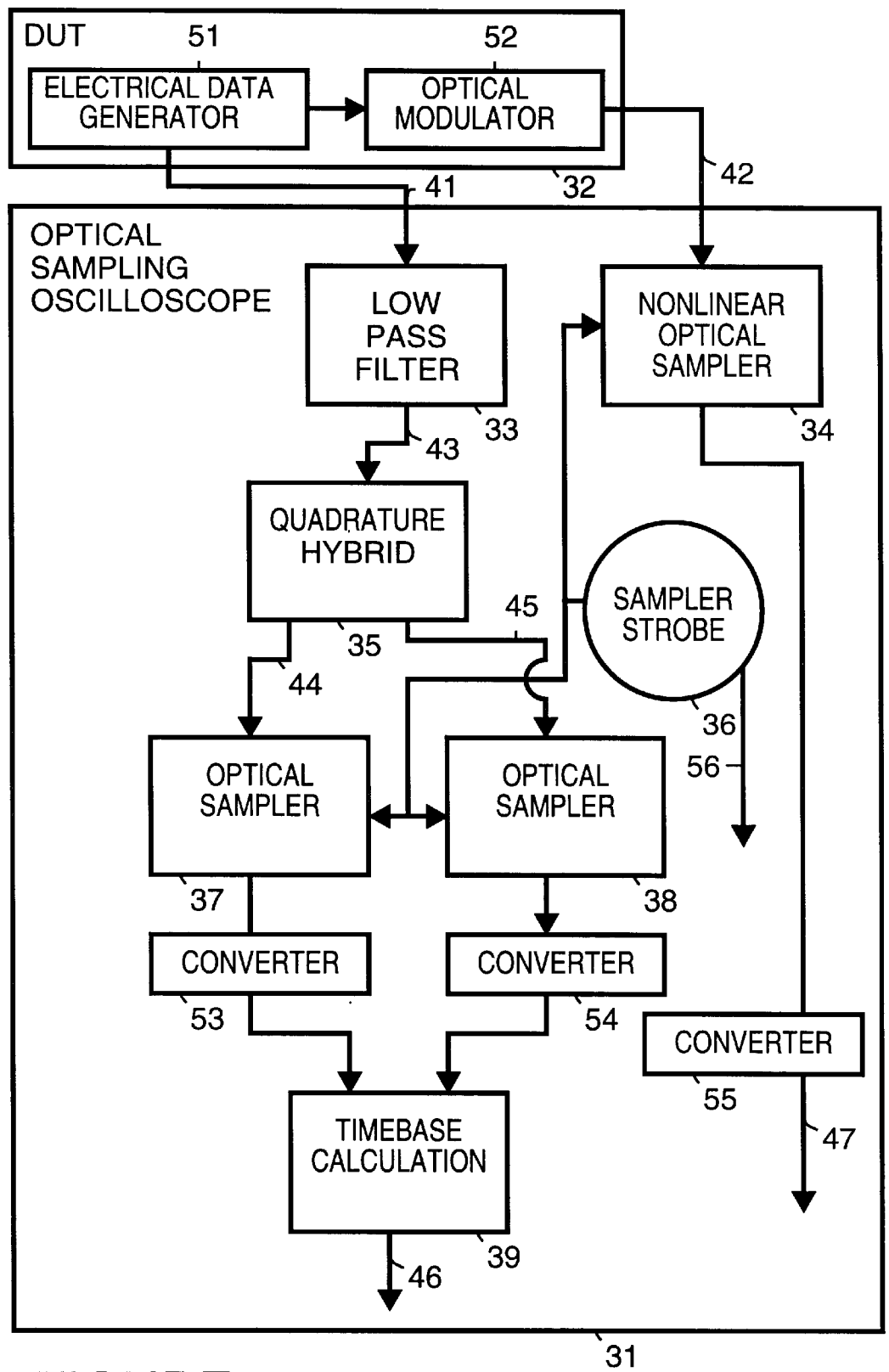
FIG. 12 is a simplified block diagram of an optical sampling oscilloscope in accordance with an alternative preferred embodiment of the present invention.

FIG. 12 is a simplified block diagram of an optical sampling oscilloscope 31. Optical sampling oscilloscope 31 is used, for example, to sample signals with bandwidths much higher than could be sampled by electrical sampling oscilloscope 11. For example, electrical sampling oscilloscope 11 performs sampling in the range of 50 gigahertz (GHz), while optical sampling oscilloscope 31 is able to perform sampling at bandwidths greater than one terahertz (THz).

A device under test 32 includes an electrical data generator 51 and an optical modulator 52. Electrical data generator 51 supplies to optical sampling oscilloscope 31 a synchronous electrical clock reference signal 41. Optical modulator 52 supplies to optical sampling oscilloscope 31 an optical data signal 42. Synchronous electrical clock reference signal 41 is used for horizontal time base information. Optical data signal 42 is synchronous with synchronous electrical clock reference signal 41. Optical data signal 42 is used for the vertical channel information.

A sampler strobe 36, when used as an oscilloscope trigger for eye diagrams, is free-running (random sampling). Sampler strobe 36 is used to simultaneously strobe a non-linear optical sampler 34, an optical sampler 37 and an optical sampler 38. Non-linear optical sampler 34, optical sampler 37 and optical sampler 38 thus all sample at the same time.

Sampler strobe 36 is implemented, for example, as a fiber ring laser having a repetition frequency of, for example, 50 MHz. The strobe generated by sampler strobe 36 is asynchronous both to optical data signal 42 and synchronous electrical clock reference signal 41. In one preferred embodiment, the sampling pulse frequency is approximately 50 MHz, the optical sampling pulse width is approximately 0.2 picoseconds (ps), and the clock reference frequency is approximately 10 GHz. Achievable jitter in the time base measurement is less than 100 femtoseconds (fs).

Non-linear optical sampler 34 samples optical data signal 42. A slow optical/electrical and analog to digital converter 55 provides a vertical channel signal 47 which provides the vertical channel information used by oscilloscope 31 to generate a display.

A low pass filter 33 receives synchronous electrical clock reference signal 41 and generates a sinusoidal clock reference signal 43. A quadrature hybrid circuit 35 receives sinusoidal clock reference signal 43 and generates two signals ninety degrees out of phase, a sine reference signal 44 and a cosine reference signal 45.

Optical sampler 37 samples sine reference signal 44 and forwards the results to a slow optical/electrical and analog to digital converter 53. Slow optical/electrical and analog to digital converter 53 sends a converted signal to a time base calculation circuit 39. Optical sampler 38 samples cosine reference signal 45 and forwards the results to a slow optical/electrical and analog to digital converter 54. Slow optical/electrical and analog to digital converter 54 sends a converted signal to time base calculation circuit 39. Time base calculation circuit 39 performs an arctangent operation on the signals received from a slow optical/electrical and analog to digital converter 53 and slow optical/electrical and analog to digital converter 54 to produce a time axis channel information reference signal 46.

For example, optical sampler 37 and optical sampler 38 are each implemented using a Mach Zehnder optical modulator. The insertion loss of each Mach Zehnder optical modulator is dependent on the instantaneous voltage on the modulator provided by the reference signals provided to the modulator. The optical sampling pulse amplitude (energy) is dependent on the insertion loss of the modulator. The optical pulse energy can be measured with a slow optical detector (e.g., a slow optical/electrical and analog to digital converter).

Non-linear optical sampler 34 converts the wavelength of optical data signal 42 during the time aperture of the 0.2 ps optical sampling pulse. The wavelength converted output is optically filtered and measured with a slow optical detector (e.g., a slow optical/electrical and analog to digital converter that measures converted pulse energy).

In instruments such as electrical sampling oscilloscope 11 and optical sampling oscilloscope 31, a measured parameter (e.g. voltage or optical power) is displayed on a vertical axis as a function of time represented on the horizontal axis.

In an alternative embodiment, an optical sampling system time base portion of optical sampling oscilloscope 31 can be constructed using a single modulator and a single A/D converter to reduce system cost and complexity. The optical sampling pulse measures the amplitude of the electrical input signal at two points in time. The optical sampling signal is split and delayed by an amount greater than the sampling time of an analog to digital (A/D) converter's sample and hold circuit. Two A/D conversions are then performed: on the original and the delayed signals. The delay is adjusted using the variable optical delay line to put the two samples roughly in quadrature for a given electrical sinusoidal input frequency. Phase noise of the electrical input signal will give some phase error in the second sample, since the two sampling times are several tens of cycles of the electrical clock reference apart. This can add jitter to the time base phase measurement.

The phase noise limitation can be partially circumvented as follows. The second sample (with added phase jitter) only needs to distinguish between the rising and falling edge (180 degrees of phase), it is not used for exact time base placement of the sampling point. Only the non-delayed sampling pulse is used to determine the exact phase. The delayed pulse resolves the ambiguity as to whether the sampled electrical signal is on a rising or falling edge of the sinusoid. Only those samples which have undelayed sampling amplitudes within a range where the slope of the sinusoidal electrical clock reference is large are used. This insures that the determination of the phase (time base delay) of the electrical clock reference is most accurate (giving less jitter). Other samples are discarded. Only-50% of the samples are used. To obtain the full trace, the variable delay must be changed by ½ cycle of the electrical clock reference, and the measurement repeated. The two traces are then stitched together.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for performing repetitive sampling of a data signal, the method comprising the following steps:
    (a) generating a clock reference, wherein the clock reference has a known period relationship with the data signal;
    (b) sampling the clock reference;
    (c) sampling the data signal, wherein there is a known time relationship between the sampling of the clock reference and the sampling of the data signal; and,
    (d) using sampled information from the clock reference to determine in what phase of the clock reference sampled values of the data signal occur.

2. A method as in claim 1 wherein in step (b) and step (c) the sampling of the clock reference and the sampling of the data signal is simultaneous.

3. A method as in claim 1 wherein in step (a) the data signal is a repetitive digital pattern that has a pattern trigger that always occurs at a selected bit position in the repetitive digital pattern.

4. A method as in claim 3 wherein in step (d) information about phase determined in step (d) is used to correct timing errors in sampling the repetitive digital pattern.

5. A method as in claim 1 wherein sampling of the clock reference in step (b) and sampling of the data signal in step (c) are performed with a known time relationship to a sequential time base trigger.

6. A method as in claim 1 wherein in step (a) the clock reference is composed of a single signal with a waveform roughly in a shape of a sawtooth.

7. A method as in claim 1 wherein in step (a) the clock reference is composed of two signals in quadrature.

8. A method as in claim 1 wherein in step (a) the clock reference is composed of two approximately sinusoidal signals in quadrature.

9. A method as in claim 1 wherein step (a) comprises the following substeps:
   (a.1) receiving a single clock reference signal from a device under test;
   (a.2) filtering the single clock reference signal to produce a filtered signal; and,
   (a.3) performing a hybrid quadrature operation to produce two signals in quadrature.

10. A method as in claim 1 wherein in step (b) the clock reference is optically sampled and wherein in step (c) the data signal is optically sampled.

11. A method as in claim 1 wherein in step (b) the clock reference is electronically sampled and wherein in step (c) the data signal is electronically sampled.

12. A method as in claim 1 wherein in step (b) the data signal is optically sampled and wherein in step (c) the clock reference is electronically sampled.

13. A device that performs repetitive sampling of a data signal, the device comprising:
   a first sampling circuit for sampling the data signal;
   a second sampling circuit for sampling a clock reference, wherein the clock reference has a known period relationship with the data signal;
   a timing circuit for assuring a known time relationship between sampling performed by the first sampling circuit and the second sampling circuit; and,
   calculation circuitry that uses sampled information from the clock reference to determine in what phase of the clock reference sampled values of the data signal occur.

14. A device as in claim 13 wherein the data signal is a repetitive digital pattern that has a pattern trigger that always occurs at a selected bit position in the repetitive digital pattern.

15. A device as in claim 13 wherein the clock reference is composed of a single signal with a waveform roughly in a shape of a sawtooth.

16. A device as in claim 13 wherein the clock reference is composed of two signals in quadrature.

17. A device as in claim 13 wherein the clock reference is composed of two approximately sinusoidal signals in quadrature.

18. A device as in claim 13 additionally comprising:
   a filtering circuit that receives a single clock reference signal from a device under test and filters the single clock reference signal to produce a filtered signal; and,
   a hybrid quadrature circuit that performs a hybrid quadrature operation on the filtered signal to produce two signals in quadrature, the two signals in quadrature being the clock reference.

19. A device as in claim 13 wherein the first sampling circuit performs optical sampling of the data signal and the second sampling circuit performs optical sampling of the clock reference.

20. A device as in claim 13 wherein the first sampling circuit performs optical sampling of the data signal and the second sampling circuit performs electrical sampling of the clock reference.

21. A device as in claim 13 wherein the first sampling circuit performs electrical sampling of the data signal and the second sampling circuit performs electrical sampling of the clock reference.

22. A device as in claim 13 wherein the timing circuit includes:
   a sequential time base for generating a common sampling strobe.

* * * * *